United States Patent
Limb et al.

(10) Patent No.: US 9,356,603 B2
(45) Date of Patent: May 31, 2016

(54) THERMALLY TEMPERED GLASS SUBSTRATE USING CTE MISMATCHED LAYERS AND PASTE MIXTURES FOR TRANSIENT ELECTRONIC SYSTEMS

(71) Applicant: Palo Alto Research Center Incorporated, Palo Alto, CA (US)

(72) Inventors: Scott J. H. Limb, Palo Alto, CA (US); Gregory L. Whiting, Menlo Park, CA (US); Sean R. Garner, San Francisco, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 14/694,121

(22) Filed: Apr. 23, 2015

(65) Prior Publication Data

US 2015/0358021 A1 Dec. 10, 2015

Related U.S. Application Data

(63) Continuation-in-part of application No. 14/052,348, filed on Oct. 11, 2013, now Pat. No. 9,154,138.

(51) Int. Cl.

| | |
|---|---|
| *H01L 23/15* | (2006.01) |
| *C03C 4/00* | (2006.01) |
| *H03K 19/177* | (2006.01) |
| *B32B 7/02* | (2006.01) |
| *B32B 17/00* | (2006.01) |

(Continued)

(52) U.S. Cl.
CPC ............ *H03K 19/17768* (2013.01); *B32B 7/02* (2013.01); *B32B 17/00* (2013.01); *C03B 19/09* (2013.01); *C03B 23/203* (2013.01); *C03C 3/00* (2013.01); *C03C 4/0064* (2013.01); *H01L 21/71* (2013.01); *H01L 23/14* (2013.01); *H01L 23/15* (2013.01); *H01L 27/00* (2013.01); *B32B 2457/08* (2013.01); *B32B 2457/14* (2013.01); *H01L 2924/0002* (2013.01); *Y10T 428/24942* (2015.01)

(58) Field of Classification Search
CPC .............................. C03C 4/0064; H01L 23/15
See application file for complete search history.

(56) References Cited

U.S. PATENT DOCUMENTS

| | | | |
|---|---|---|---|
| 4,102,664 A * | 7/1978 | Dumbaugh, Jr. .......... | C03B 7/00 216/33 |
| 4,598,274 A | 7/1986 | Holmes | |
| 7,554,085 B2 | 6/2009 | Lee | |
| 8,130,072 B2 | 3/2012 | De Bruyker et al. | |

(Continued)

*Primary Examiner* — Evan Pert
(74) *Attorney, Agent, or Firm* — Bever, Hoffman and Harms, LLP

(57) ABSTRACT

A thermally tempered glass substrate for transient electronic systems (i.e., including electronic devices that visually disappear when triggered to do so) including two or more fused-together glass structures having different coefficient of thermal expansion (CTE) values disposed in an intermixed arrangement manner that generates and stores potential energy in the form of residual, self-equilibrating internal stresses. In alternative embodiments the substrate includes laminated glass sheets, or glass elements (e.g., beads or cylinders) disposed in a glass layer. A trigger device causes an initial fracture in the thermally tempered glass substrate, whereby the fracture energy nearly instantaneously travels throughout the thermally tempered glass substrate, causing the thermally tempered glass substrate to shatter into multiple small (e.g., micron-sized) pieces that are difficult to detect. Patterned fracture features are optionally provided to control the final fractured particle size. Electronic systems built on the substrate are entirely destroyed and dispersed during the transience event.

20 Claims, 8 Drawing Sheets

(51) Int. Cl.
- *C03B 23/203* (2006.01)
- *C03B 19/09* (2006.01)
- *C03C 3/00* (2006.01)
- *H01L 21/71* (2006.01)
- *H01L 23/14* (2006.01)
- *H01L 27/00* (2006.01)

(56) References Cited

U.S. PATENT DOCUMENTS

2013/0140649 A1  6/2013  Rogers et al.
2014/0323968 A1  10/2014  Rogers et al.

* cited by examiner ated to transient electronic systems, and
in particular to substrates used in transient electronic systems.

THERMALLY TEMPERED GLASS SUBSTRATE USING CTE MISMATCHED LAYERS AND PASTE MIXTURES FOR TRANSIENT ELECTRONIC SYSTEMS

RELATED APPLICATIONS

This application is a continuation-in-part (CIP) of U.S. patent application for "Stressed Substrates For Transient Electronic Systems", U.S. application Ser. No. 14/052,348, filed Oct. 11, 2013.

STATEMENT REGARDING FEDERALLY SPONSORED RESEARCH OR DEVELOPMENT

This invention is based upon work supported by DARPA under Contract No. HR0011-14-C-0013 (3765). Therefore, the Government has certain rights to this invention.

FIELD OF THE INVENTION

This invention relates to transient electronic systems, and in particular to substrates used in transient electronic systems.

BACKGROUND OF THE INVENTION

Large area sensing is critical for a variety of military, ecological and commercial interests and has historically been served through the use of centralized long-range sensors. However, rapid improvements in miniaturization of electronic systems have significantly improved the capabilities of small sensor devices. These micro-sensors have the potential to create "large N" distributed networks with advantages in operational adaptability, non-traditional sensing modalities that are only possible with close proximity, increased sensitivity and knowledge extraction through networked intelligence.

While distributed network systems have remarkable promise, their realistic use is limited by risks associated with their accumulation in the environment, detection and defeat, and exploitation due to inability to maintain positive control (unlike centralized long-range sensors).

The phrase "transient electronics" refers to a relatively new family of electronic devices that disappear (disaggregate and disperse) within a set period of time, making them ideally suited for distributed network systems. Conventional transient electronic systems typically rely on the use of soluble substrates and electronic materials (such as silk). When placed into solvent (typically water), these conventional substrates and electronics slowly dissolve into solution. As such, a distributed network system made up of conventional transient electronic devices can be expected to "disappear" over a relatively short amount of time (e.g., after periodic rainfall).

Although the conventional transient electronic approaches achieve the goal of causing the electronics to "disappear" after use, the long dissolution period required to achieve complete disaggregation and dispersal make the conventional approaches unfit for discrete (e.g., military) applications that require rapid and complete disaggregation upon command. Moreover, the conventional approaches utilize materials that are not compatible with existing integrated circuit fabrication and assembly techniques, requiring the development of new IC fabrication processes at significant cost.

What is needed is a substrate for transient electronics that is compatible with existing IC fabrication techniques, and achieves complete, on-command disaggregation of the electronic circuitry formed thereon.

SUMMARY OF THE INVENTION

The present invention is directed to a thermally tempered glass substrate for transient electronic devices and systems that includes multiple glass structures including two or more different glass materials having non-equal (mismatched) coefficient of thermal expansion (CTE) values, where the glass structures are disposed in an intermixed arrangement and integrally fused together such that the mismatched CTE values of the different glass materials generate and store potential energy in the form of residual, self-equilibrating internal stresses. The thermally tempered glass substrate is produced such that the self-equilibrating internal stresses are stable enough to support either mounting onto the substrate an pre-fabricated IC die, or fabricating (e.g., using printed electronic techniques) electronic elements directly onto the substrate (or by way of an intervening base functional layer, thus making the thermally tempered glass substrate compatible with existing IC fabrication techniques. The self-equilibrating internal stresses are also stable enough to facilitate normal operation of the pre-fabricated IC die or fabricated electronic elements within a host transient event device or system, but to completely disaggregate ("powderize") in response to an applied fracture force during a transient event (e.g., when the host transient event device or system detects unauthorized tampering). Specifically, when the applied initial fracture force is strong enough to destabilize and release the stored potential energy at the point of application, this energy release generates secondary fractures in the thermally tempered glass substrate that destabilized and release stored potential energy in a substantially circular pattern surrounding the initial fracture force, thereby creating a chain-reaction release of potential energy as the secondary fractures propagate throughout the thermally tempered glass substrate, whereby the thermally tempered glass substrate (and any mounted or fabricated electronics attached thereon) is powderized into micron-sized particulates (i.e., ≤100 μm across) using a mechanism similar to that captured in a Prince Rupert's Drop. Accordingly, thermally tempered glass substrates formed in accordance with the present invention are both compatible with existing IC fabrication techniques, and achieve complete, on-command (i.e., in response to an applied initial fracture force) disaggregation of the electronic circuitry formed thereon.

According to a practical embodiment of the present invention, a laminated-type thermally tempered glass substrate includes an inner (first) glass sheet (structure) sandwiched between two outer (second and third) glass sheets (second glass structures). According to a presently preferred embodiment, the laminated substrate embodiment achieves optimal powderization by implementing the inner glass sheet using a (first) glass material characterized by having a higher CTE value than that of the (second) glass material(s) of the two outer glass sheets, with the (first) glass material of the inner glass sheet preferably characterized by having a lower softening point temperature value than that of the (second) glass material of the two outer glass sheets. In one exemplary embodiment, a three-layer laminated substrate includes an inner glass sheet comprising soda-lime glass or a high-CTE Borsilicate glass such as D263-Schott glass, and two outer glass sheets comprising Quartz glass, an alkali free glass such as AF45-Schott, Willow glass, or a relatively low CTE-value Borsilicate glass such as Borofloat 33-Schott glass. In an exemplary specific three-layer laminated substrate embodiment, the inner glass sheet comprises Borsilicate (D263-Schott) glass, and the outer glass sheets comprise Willow glass. According to another exemplary practical embodiment, a five-layer laminated substrate is formed by adding two additional outermost (fourth and fifth) glass sheets to the three-layer laminated substrate, where the outermost glass sheets are formed using a (third) glass material (e.g., Willow glass) having a lower (third) CTE value than those of the first and second/third glass sheets (e.g., a high CTE-value Borsilicate glass and alkali free glass, respectively).

According to another practical embodiment, thermally tempered glass substrates are single-layer structures in which the second glass structures are implemented by multiple spaced-apart glass elements that are integrally fused inside a glass layer (first glass structure). According to a presently preferred embodiment, the single-layer substrate embodiment achieves optimal powderization by implementing the glass layer using a (first) glass material characterized by having a lower CTE value than that of the (second) glass material(s) of the multiple spaced-apart glass elements. By implementing the multiple spaced-apart glass elements using glass cylinders or glass beads, better stress containment and less unintended shattering is achieved. In one exemplary embodiment, the glass layer is formed with a thickness in the range of 200 μm and 1000 μm, and the multiple spaced-apart glass elements contained therein comprise glass beads having a diameter in the range of 25 μm and 100 μm. In a specific exemplary embodiment, the glass layer comprises an alkali free glass such as AF45-Schott, and the multiple spaced-apart glass elements comprise soda-lime glass beads.

According to another embodiment, a generalized method for producing the various thermally tempered glass substrates described above includes disposing at least one first glass structure and multiple second glass structures in an intermixed arrangement (i.e., such that a portion of the first glass structure is disposed between and contacting two or more of the second glass structures), heating the intermixed arrangement to a temperature that causes the first and second glass materials to melt and fuse together, and then cooling the melted/fused glass structures such that the difference between the mismatched CTE values of the two or more different glass materials generates and stores potential energy in the form of residual, self-equilibrating internal stresses similar to those found in thermally tempered glass. The thermally tempered glass substrate thus formed may then be utilized to produce a transient electronic device, for example, by subsequently forming or mounting a trigger device and one or more integrated circuit on the thermally tempered glass substrate.

In the case of laminated-type substrates, forming the intermixed arrangement involves sandwiching an innermost glass sheet of a first glass material type between a two glass sheets of a second glass material type (e.g., Quartz glass, a low CTE-value Borsilicate glass, Willow glass, and alkali free glass), where the first glass material type has a higher CTE value than that of the second glass material type (e.g., a high CTE-value Borsilicate glass sheet or soda-lime glass sheet). In this case, the melting and fusing occurs at the interfaces between the inward facing surfaces of the two outer glass sheets and the opposing surfaces of the inner glass sheet. Five-layer (or more) laminated-type thermally tempered glass substrates are formed by applying additional glass sheets to the stack, with the outermost glass sheets preferably having CTE values that are lower than those of the inner glass sheets to optimize the powderization process.

In the case of single-layer substrates, forming the intermixed arrangement involves forming a layer including a mixture of glass powder and glass elements (e.g., glass cylinders or beads), where the glass powder includes a first glass material having a CTE value that is lower than that of a second glass material from which the glass elements are formed. In one embodiment, the glass elements are disposed inside a paste layer formed by the glass powder, where the paste is heated until the glass powder particles melt and form a continuous glass layer around the glass elements.

According to another embodiment of the present invention, transient electronic devices are fabricated by forming a thermally tempered glass substrate using the methods mentioned above, and then disposing (i.e., fabricating or mounting) one or more electronic devices (integrated circuits) and one or more trigger mechanisms on the thermally tempered glass substrate. According to alternative embodiments, the electronic devices are attached to the thermally tempered glass substrate using various techniques. In one exemplary embodiment, already-formed microelectronic circuit IC die (chips) are attached to the substrate using a bonding method (such as using sealing glasses or anodic bonding) that allows crack propagation to destroy the adhered chips. That is, during the transience event, not only will the substrate fracture into small difficult to detect particles, but the bonded microelectronic devices will also fracture into small particulates as well. The final particle size after triggering is based upon factors such as the stress profile and substrate thickness. In one embodiment, the IC chip is thinned and/or patterned to provide fracture points (features) that assist in controlling the final fractured particle size (i.e., the fracture features are formed such that, when the substrate is powderized by release of the stored potential energy, the substrate fractures along the patterned fracture features. In another embodiment, standard thin-film fabrication (e.g., photolithographic or inkjet printing) techniques are used to fabricate the electronic devices directly into and/or on the thermally tempered glass substrate such that, upon triggering, the energy released by the thermally tempered glass substrate destroys the thin, brittle functional layers and all electronics formed thereon.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in transient electronic devices. The following description is presented to enable one of ordinary skill in the art to make and use the invention as provided in the context of a particular application and its requirements. As used herein, directional terms such as "upper", "upward", "lower", "downward", are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
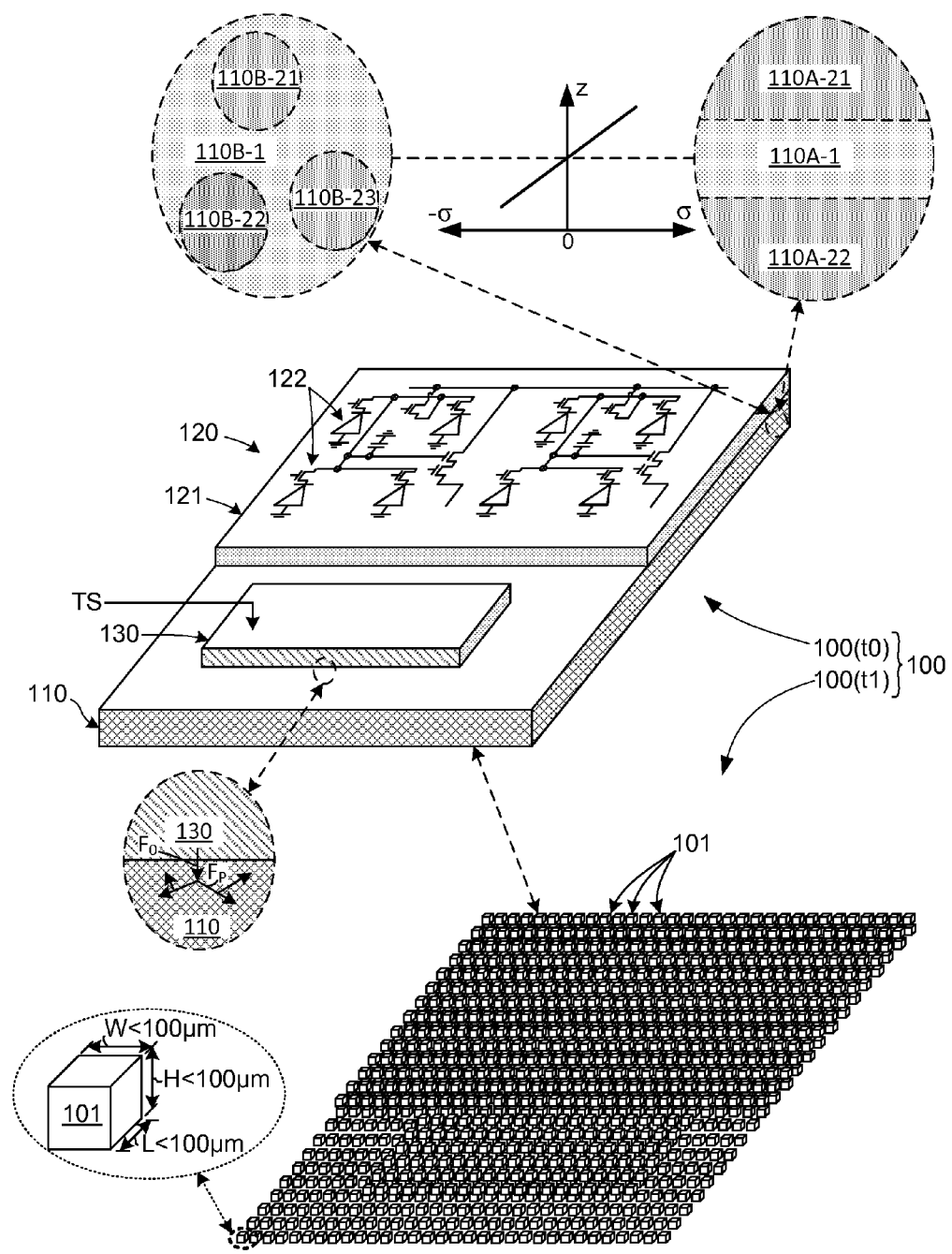
FIG. 1 is a top side perspective view showing a transient electronic device including a thermally tempered glass substrate produced in accordance with an simplified embodiment of the present invention.

FIG. 1 is a simplified diagram including perspective views showing a transient electronic device 100 in a pre-transience "whole" state (i.e., device 100(t0) shown in the middle portion of FIG. 1) and a post-transience "powderized" state (i.e., device 100(t1) shown in the lower portion of FIG. 1). Referring to the middle of FIG. 1, in the pre-transience state (e.g., immediately after production), transient electronic device 100(t0) generally includes a functional layer (e.g., an integrated circuit (IC) die or one or more printed electronic devices) 120 and a trigger mechanism 130 that are disposed on a thermally tempered glass substrate 110, which is described below. Functional layer 120 of device 100(t0) includes one or more electronic elements 122 that perform a prescribed useful function (e.g., sensor operations) up until the transient event. As described in additional detail below, trigger mechanism 130 initiates the transient event, e.g., by generating an initial fracture $F_0$ in thermally tempered glass substrate 110 (shown in the bubble immediately below device 100(t0)). As depicted by device 100(t1), the initial fracture propagates through thermally tempered glass substrate 110 and the associated structures, causing the device to undergo powderization (i.e., fragmentation into tiny particles 101, one of which is depicted in the bubble located in the lowermost portion of FIG. 1).

Referring to device 100(t0) and to the bubbles located in the uppermost portions of FIG. 1, thermally tempered glass substrate 110 is a wafer-like structure including at least one (first) glass structure including a first glass material having a first coefficient of thermal expansion (CTE) value, and multiple second glass structures respectively including one or more different (second) glass materials respectively having a second CTE value, where the second CTE value is different from the first CTE value. For example, as indicated in the upper right bubble in FIG. 1, thermally tempered glass substrate 110A includes a (first) glass structure 110A-1 disposed between two (second) glass structures 110A-21 and 110A-22, where glass structure 110A-1 comprises a different glass material having a different CTE value than the glass material from which glass structures 110A-21 and 110A-22 are formed. Similarly, as indicated in the upper left bubble of FIG. 1, thermally tempered glass substrate 110B includes (second) glass structures 110B-21, 110B-22 and 110B-23 disposed in a (first) glass structure 110B-1, where glass structure 110B-1 comprises a different glass material than that of glass structures 110B-21 to 110B-23.

According to an aspect of the invention, the different glass structures of thermally tempered glass substrate 110 are integrally attached (i.e., fused together by way of melting and then cooling) such that the different (mismatched) CTE values of the two glass materials generate, during the post-melt cooling process, residual tensile and compressive stresses that form a stress profile similar to that of tempered glass. That is, the glass materials are heated to a temperature above their glass melting points, whereby the glass structures expand at a rate determined by each glass material's CTE value and become operably integrally connected together, and then the glass materials are cooled to room temperature. Of course, as each glass material cools, it shrinks at a rate determined by each glass material's CTE value. By cooling the glass at an appropriate rate, the fused glass structures remain connected to each other as they cool, whereby the different shrinking rates produce localized tensile and compressive stresses at the interface regions between the glass structures (e.g., in the planar interface regions between plate-like glass structure 110A-1 and plate-like glass structures 110B-21 and 110B-22 in the upper right bubble of FIG. 1, and in the curved interface regions between the material forming glass layer structure 110B-1 and bead-like structures 110B-21 to 110B-23 and structures 110B-21 and 110B-22 in the upper left bubble of FIG. 1). When properly produced, the residual tensile and compressive stresses are self-equilibrating and produce a stress gradient (e.g., as nominally indicated by the simplified stress graph shown at the right of the bubble). Note that the arrangements shown in the upper bubbles of FIG. 1 are not intended to be limiting in that one or more non-thermally tempered glass substrate layers may be disposed between the two stress-engineered layers, and in that the stress gradient is not necessarily linear.

Referring to the middle of FIG. 1, functional layer 120 includes either an IC die (chip) 121 having IC circuits 122 fabricated thereon, or a suitable base layer 121 comprising a semiconductor material (e.g., $SiO_2$) that is compatible with existing IC fabrication techniques, and one or more electronic elements 122 that are fabricated on and in base layer 121 (e.g., by way of printed electronic techniques) that perform one or more designated (e.g., sensor) operations. As described in additional detail below, functional layer 120 is operably attached to the thermally tempered glass substrate 110 such that release of the potential energy powderizes both thermally tempered glass substrate 110 and functional layer 120, along with any electronic devices disposed thereon.

Referring to the lower-middle portion of FIG. 1, trigger mechanism 130 serves to initiate a transient event that controls the release of potential energy stored in thermally tempered glass substrate 110 in response to a suitable trigger signal TS (e.g., an externally delivered current pulse or a radio frequency signal). According to another aspect of the invention, the residual tensile and compressive stresses described above remain stable until thermally tempered glass substrate 110 is subjected to an externally applied initial fracture force that is sufficiently strong enough to generate secondary fractures in thermally tempered glass substrate 110. As indicated in the middle bubble of FIG. 1, trigger mechanism 130 is disposed on substrate 110 and constructed such that the transient event is initiated, for example, by generating and applying an initial fracture $F_O$ onto thermally tempered glass substrate 110. As indicated in the middle bubble, this initial fracture $F_O$ is propagated by way of secondary fractures $F_P$ that travel rapidly throughout thermally tempered glass substrate 110, whereby the potential energy stored in thermally tempered glass substrate 110 is suddenly and catastrophically released in a manner that completely disaggregates (powderizes) the thermally tempered glass substrate into micron-sized particulates 101 (i.e., having length L, width W, and height H dimensions that are less than approximately 100 μm across, as illustrated in the bubble located at the bottom of FIG. 1).

According to an aspect of the present invention, the mechanism by which transient device 100 is powderized during the above-described transient event is similar to that associated with a Prince Rupert's Drop. A Prince Rupert's Drop is formed by simply dropping a bead of molten glass into water, cooling the surface of the drop much more rapidly than the bulk during solidification. This leads to compressive stress on the surface of the glass and tensile stress within the bulk. The resulting glass is very strong as the surface stress resists cracking, however the tail is thin enough that it can be broken; when this is done the elastic strain energy within the drop is released rapidly (fracture propagation steeps are >1000 ms$^{-1}$) and the drop is shattered into powder. The disaggregation of thermally tempered glass substrate 110 in response to a transient event trigger signal TS is similar to that of a Prince Rupert's Drop, and hence the terms "powderize" and "powderization" are defined herein to describe a disaggregation event similar to that associated with a Prince Rupert's Drop.

Referring to the lower portion of FIG. 1, by utilizing suitable device fabrication techniques and trigger mechanisms (some of which are described below), the above-mentioned transient event facilitates the controlled nearly instantaneous powderization of the entirety of device 100(t1) (i.e., functional layer 120) into particles of 100 μm or smaller that are not discernible by the human eye at greater than 50 cm viewing distance. That is, by storing sufficient potential energy in thermally tempered glass substrate 110 to powderize functional layer 120, and by providing trigger mechanism 130 for releasing the potential energy on command, the present invention facilitates the production of transient electronic devices 100 that reliably essentially disappear on command and in a significantly shorter amount of time than is possible using conventional (e.g., soluble substrate) approaches. Moreover, because thermally tempered glass substrate 110 is compatible with low-cost existing IC fabrication techniques, the present invention facilitates the production of transient electronic systems having custom-fabricated IC devices and/or the incorporation of high-performance off-the-shelf electronic devices with minimal (or potentially without any) modification to core IC fabrication process.

Figure 2:
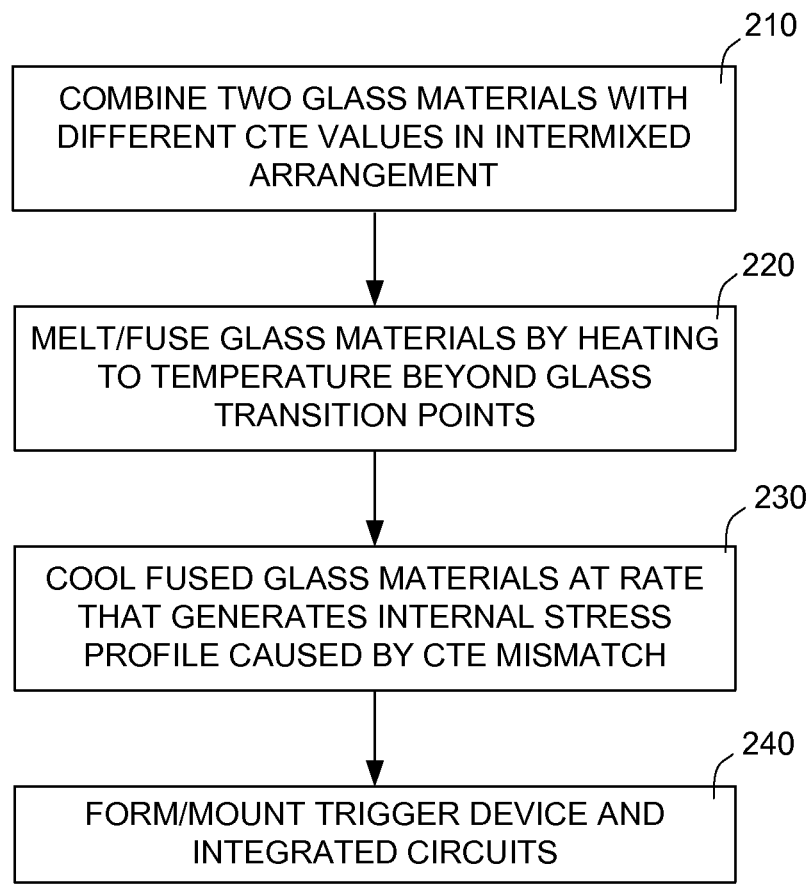
FIG. 2 is a flow diagram showing a generalized method for producing the transient electronic device depicted in FIG. 1.

FIG. 2 is a simplified flow diagram showing a generalized method for producing transient electronic device 100 (FIG. 1), where blocks 210 to 230 provide a generalized method for producing thermally tempered glass substrate 100 (FIG. 1), and block 240 indicates a generalized process for subsequently disposing trigger mechanism 130 (FIG. 1) and one or more electronic elements (e.g., IC die 120, FIG. 1) on thermally tempered glass substrate 110. Referring to block 210 (upper portion of FIG. 2), the generalized method begins by combining two glass materials having different CTE values in an intermixed arrangement (i.e., such that a portion of each glass structure of the first glass material type is disposed between and contacting two or more of glass structures of the second glass material type). Exemplary combinations satisfying block 210 are described below with reference to FIGS. 3(A) and 4(A). In block 220 (FIG. 2), the intermixed arrangement is heated to a temperature above the glass transition points of the two glass materials, causing the first and second glass structures to melt and fuse together. Exemplary melting/fusing processes that satisfy block 220 are described below with reference to FIGS. 3(B) and 4(B). In block 230 (FIG. 2), the melted/fused glass structures are cooled at a rate that causes the mismatched CTE values of the two different glass materials to generate and store potential energy in the form of residual, self-equilibrating internal stresses having a stress profile that is similar to that found in thermally tempered glass. Exemplary cooling processes that satisfy block 230 are described below with reference to FIGS. 3(C) and 4(C). Referring to block 240 (FIG. 2), after sufficiently cooling the thermally tempered glass substrate, a trigger device and one or more integrated (electronic) circuits are either formed or mounted thereon using, for example, the various techniques described below with reference to FIGS. 5(A) to 7(E).

The bubbles located at the top of FIG. 1 indicate that thermally tempered glass substrates may be produced in accordance alternative embodiments of the present invention, some of which are described below. FIGS. 3 and 3(A) to 3(C) illustrate the production of a laminated-type thermally tempered glass substrate 110A according to a first exemplary specific embodiment, where laminated-type thermally tempered glass substrate 110A is characterized by an inner (first) glass sheet (structure) 110A-1 sandwiched between two outer (second and third) glass sheets (second glass structures) 110A-21 and 100A-22. FIGS. 4 and 4(A) to 4(C) illustrate the production of a single-layer-type thermally tempered glass substrate characterized by multiple spaced-apart glass elements (second glass structures) 110B-21, 110B-22 and 110B-23 that are integrally attached (fused inside) a single glass layer (first glass structure) 110B-1. Additional features and details associated with these two approaches are provided below. The features and details mentioned below with reference to these two exemplary embodiments are intended to be exemplary and not intended to be limiting.

Figure 3:
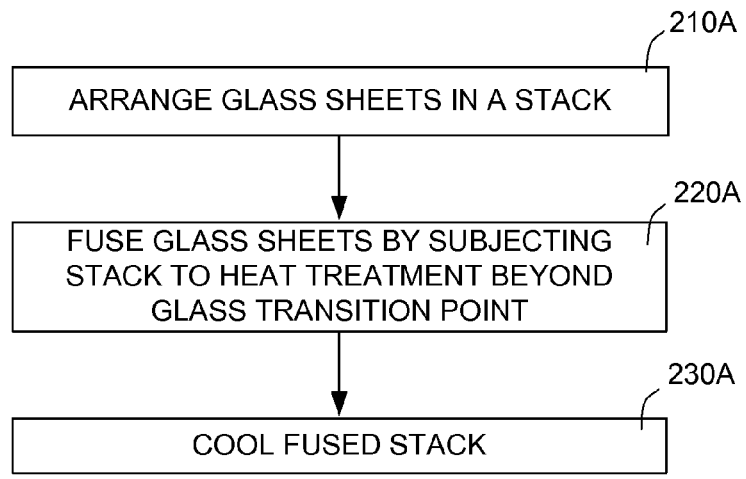
FIG. 3 is a flow diagram showing a generalized method for producing a laminated-type thermally tempered glass substrate according to an embodiment of the present invention.
Figure 3A:
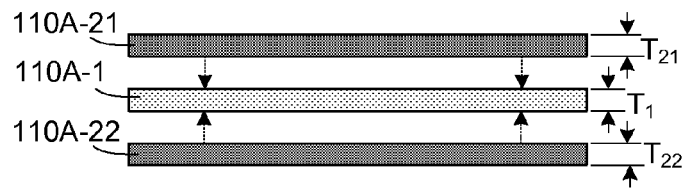
FIGS. 3(A), 3(B) and 3(C) are simplified cross-sectional side views depicting exemplary structures generated during various stages of the production method of FIG. 3.

Referring to block 210A at the upper portion of FIG. 3 and to FIG. 3(A), the production of laminated-type thermally tempered glass substrates begins by sandwiching an inner (first) glass sheet 110A-1 between two outer (second and third) glass sheets 110A-21 and 110A-22. In an exemplary embodiment, glass sheet 110A-1 is a flat glass sheet having a thickness $T_1$ in the range of 40 μm and 400 μm, and glass sheets 110A-21 and 110A-22 are glass sheets having respective thicknesses $T_{21}$ and $T_{22}$ in the range of 20 μm and 200 μm. In one embodiment, inner glass sheet 110A-1 comprises a first glass material characterized as having a relatively high (first) CTE value and a relatively low (first) softening temperature, and outer glass sheets 110A-21 and 110A-22 comprise a different (second) glass material characterized by a relatively low (second) CTE value and a relatively high (second) softening temperature. It is presently believed that optimal powderization occurs when the first CTE value of the glass material used for inner glass sheet 110A-1 is higher than the second CTE value of outer glass sheets 110A-21 and 110A-22. It is also presently believed important for the glass materials to be selected such that the first softening temperature value of inner glass sheet 110A-1 be lower than the second softening temperature of outer glass sheets 110A-21 and 110A-22. Exemplary high CTE/low softening temperature glass materials suitable for inner glass sheet 100A-1 include soda-lime glass (CTE=9.4 ppm/C, Anneal temp at 13 dPa viscosity=514 C, and softening temp at 7.6 dPa viscosity=696 C) or a high-CTE Borsilicate glass such as D263-Schott glass (CTE=7.2 ppm/C, Anneal temp=557 C, and softening temp=736 C). Exemplary low CTE/high softening temperature glass materials include Quartz (CTE=3.2 ppm/C, Anneal temp=717 C, and softening temp=970 C), a low-CTE Borsilicate glass such as Borofloat 33-Schott glass (CTE=3.2 ppm/C, Anneal temp=560 C, and softening temp=820 C), Willow glass (CTE=4.0 ppm/C, Anneal temp=720 C, and softening temp=970 C), or an alkali-free glass such as AF45-Schott (CTE=4.5 ppm/C, Anneal temp=663 C, and softening temp=883 C). In an experiment, suitable characteristics were produced by implementing inner glass sheet 110A-1 using Borsilicate D263-Schott glass and implementing outer glass sheets 110A-21 and 110A-22 using Willow glass.

Figure 3B:
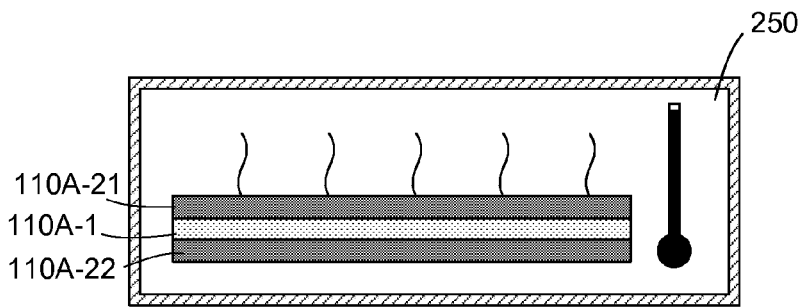

Referring to block 220A and to FIG. 3(B), the stack formed by inner glass sheet 110A-1 and outer glass sheets 110A-21 and 110A-22 is then placed in a furnace/oven 250 and heated to a temperature above the glass transition temperature of both types of glass (i.e., above the softening temperature of outer glass sheets 110A-21 and 110A-22), thereby simultaneously fusing inner glass sheet 110A-1 to outer glass sheets 110A-21 and 110A-22.

Figure 3C:
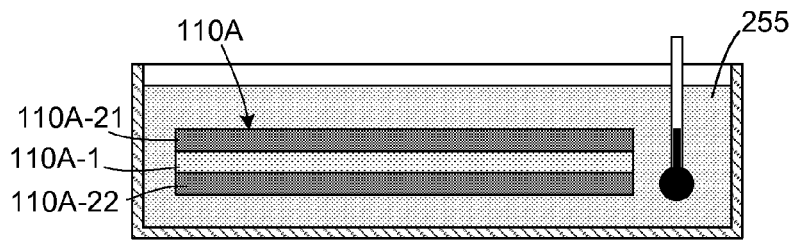

Referring to block 230A and to FIG. 3(C), the fused stack including inner glass sheet 110A-1 and outer glass sheets 110A-21 and 110A-22 is then placed in a cooling apparatus (e.g., a quenching bath) 255 and cooled to room temperature at a rate of 0.1 C/s, whereby the production of laminated-type thermally tempered glass substrate 110A is completed.

Figure 4:
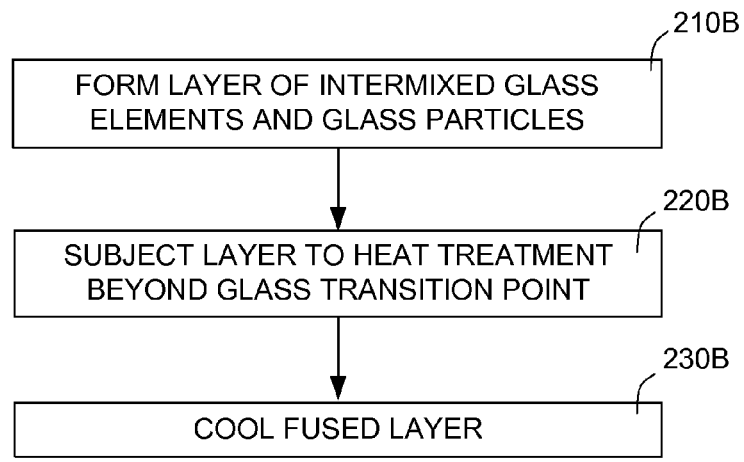
FIG. 4 is a flow diagram showing a generalized method for producing a single-layer-type thermally tempered glass substrate according to another embodiment of the present invention.
Figure 4A:
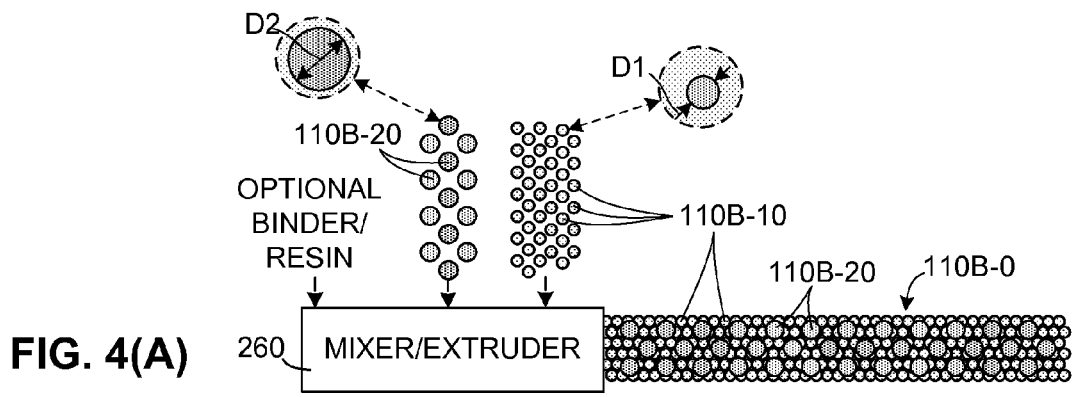
FIGS. 4(A), 4(B) and 4(C) are simplified cross-sectional side views depicting exemplary structures generated during various stages of the production method of FIG. 4.

Referring to block 210B at the upper portion of FIG. 4 and to FIG. 4(A), the production of single-layer-type thermally tempered glass substrates begins by mixing (first) glass powder particles 110B-10 and glass elements 110B-20 with an optional binder or resin to form a paste layer 110B-0. In an exemplary embodiment, glass particles 110A-10 have a nominal size/diameter D1 of 5 μm or less, and glass elements 110B-20 comprise either glass cylinders or glass beads having a nominal size/diameter D2 in the range of 50 μm and 100 μm. In one embodiment, glass powder 110B-10 comprises a first glass material characterized as having a relatively low (first) CTE value and a relatively high (first) softening temperature, and glass elements 110A-20 comprise a different (second) glass material characterized by a relatively high (second) CTE value and a relatively low (second) softening temperature. It is presently believed that optimal powderization of single-layer-type thermally tempered glass substrate occurs when the first CTE value of the glass material is lower than the second CTE value of glass elements. In an experiment, suitable characteristics were produced by implementing glass powder 110B-10 using an alkali-free glass such as AF45-Schott glass, and implementing glass elements 110B-20 using soda-lime glass.

Figure 4B:
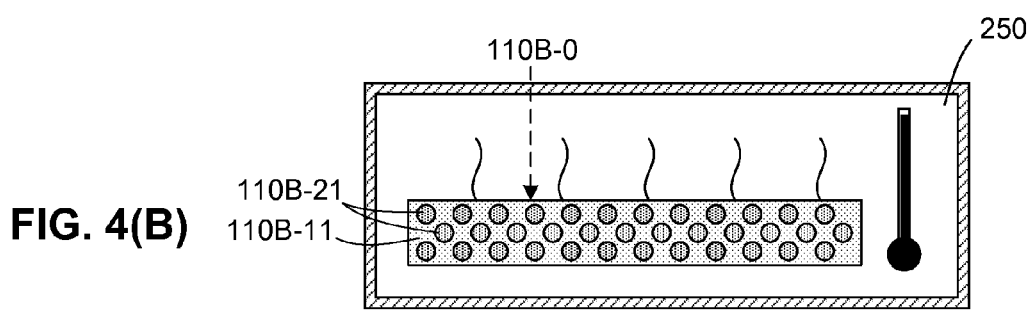

Referring to block 220B and to FIG. 4(B), the paste formed by glass powder particles 110A-10 and glass elements 110B-20 is then placed in furnace/oven 250 and heated to a temperature above the glass transition temperature of both types of glass (i.e., above the softening temperature of glass powder particles 110B-10) such that the glass powder particles melt and flow together to form a continuous glass layer 110B-11 that surrounds and contains glass elements 110B-21.

Figure 4C:
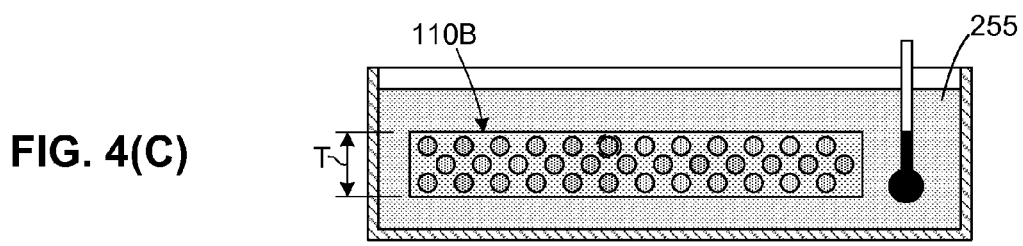

Referring to block 230B and to FIG. 4(C), the fused layer including glass elements 110B-21 disposed in glass layer 110B-11 is then placed in a cooling apparatus (e.g., a quenching bath) 255 and cooled to room temperature at a rate of 0.1 C/s, whereby the production of single-layer-type thermally tempered glass substrate 110B is completed. In one embodiment, glass layer 110B-11 has a thickness T in the range of 200 μm and 1000 μm.

FIGS. 5(A) to 5(F) depict the fabrication and subsequent actuation of a transient electronic device 100D according to another embodiment of the present invention.

Figure 5A:
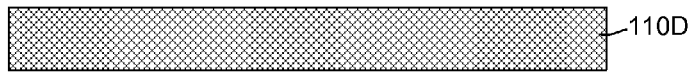
FIGS. 5(A), 5(B), 5(C), 5(D), 5(E), 5(F) and 5(G) are cross-sectional side views showing a transient electronic device produced in accordance with another embodiment of the present invention.

FIG. 5(A) depicts a thermally tempered glass substrate 110D produced in accordance with any of the methodologies mentioned above.

Figure 5B:
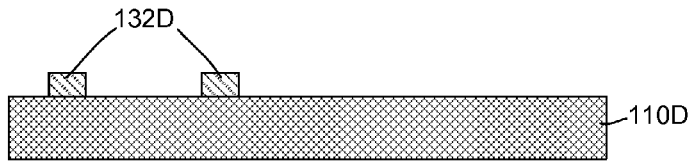
Figure 5C:
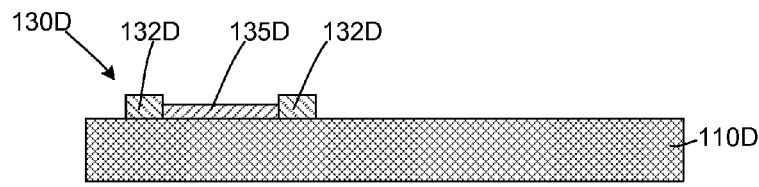

FIGS. 5(B) and 5(C) depict the formation of a trigger mechanism 130D on thermally tempered glass substrate 110D according to a currently preferred embodiment. Trigger mechanism 130D is electrical, and more specifically utilizes a heating element to generate local heating in response to an applied electrical pulse. As indicated in these figures, trigger mechanism 130D is constructed by forming a wide/thicker lower resistance electrodes 132D (shown in FIG. 5(B)), and then forming a resistive, thin, narrow resistor structure 135D (shown in FIG. 5(C)) between electrodes 132D, where resistor structure 135D is formed using a material that is capable of sustaining high temperature (e.g., a mental such as tungsten). Trigger mechanism 130D is fabricated directly onto thermally tempered glass substrate 110D using standard microfacrication techniques (vapor deposition and photo-patterning) or simply through shadow-masked evaporation. The mechanism of fracture generated by trigger mechanism 130D is hoop stress generated as the portion of thermally tempered glass substrate 110D heated by resistor structure 135D expands. Simulation of such triggering mechanisms indicate that 0.5 ms after the current pulse is applied, tensile hoop stresses in the range of 100-150 MPa are present below the resistor structure—this would be sufficient to initiate fracture in almost any traditionally tempered glass. These simulation results show that large surface tensile stresses can be obtained with a modest amount of current and energy. In this example, based on resistance estimates using properties for tungsten, the current is approximately 70 mA, and the voltage developed across the resistor is about 80 mV. These amounts are well within the capabilities of currently available small-form-factor batteries.

Figure 5D:
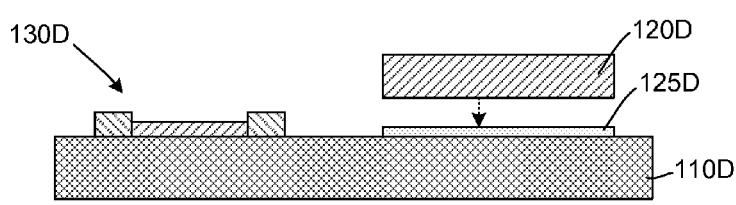

FIG. 5(D) depicts the disposition of an IC device 120D on thermally tempered glass substrate 110D according to a currently preferred embodiment. The preferred circuit proxy is a bare single-crystal silicon chip, thinned via CMP to realistic thicknesses. The inventors do not believe that the lack of CMOS processing layers changes the mechanical properties of the proxy chip significantly compared to actual chips. The key to achieving fragmentation of this type of chip is coupling the propagating cracks from thermally tempered glass substrate 110D into the silicon of IC chip 120D. This process can be viewed as a competition between two possible outcomes: a crack can propagate upward into the silicon, or make a sharp turn and instead propagate through the bond region, leading to de-bonding. To exceed the ratio needed for a glass/silicon bond, a low-melting-point sealing glass 125D is utilized to secure IC 120D to thermally tempered glass substrate 110D. Alternatively, an anodic, eutectic and adhesive bonding is used to secure IC 120D to thermally tempered glass substrate 110D.

Figure 5E:
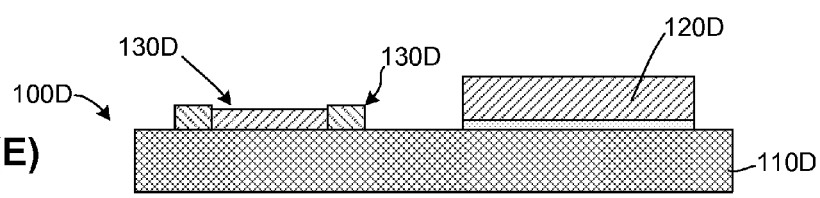
Figure 5F:
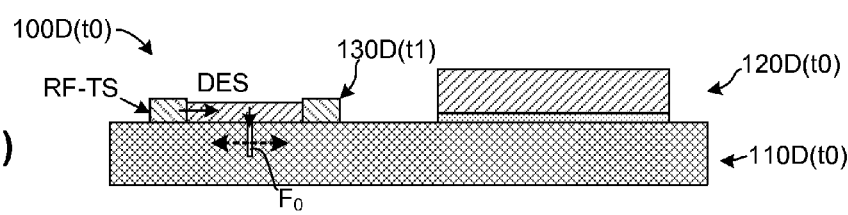
Figure 5G:
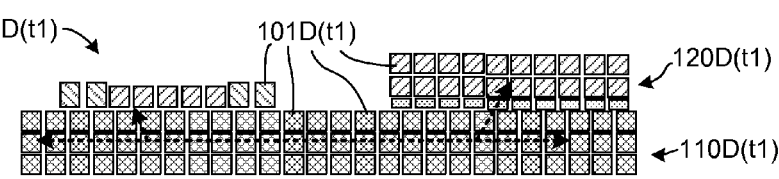

FIGS. 5(E) to 5(G) illustrate the subsequent completion and actuation of transient electronic device 100D. FIG. 5(E) depicts completed device 100D formed by thermally tempered glass substrate 110D, IC chip (functional substrate or layer) 120D, and triggering mechanism 130D. FIGS. 5(F) and 5(G) show the subsequent controlled destruction (disaggregation) of device 100D, with FIG. 5(F) depicting device 100D (t0) during the transmission of a radio-frequency trigger signal RF-TS to triggering mechanism 130D, which in turn generates an initial fracture $F_0$ in thermally tempered glass substrate 110E by way of localized heating, and FIG. 5(G) depicting the subsequent powderized device 100D(t1) caused by the propagation of fractures throughout the various structures, thereby forming particles 101E(t1).

In addition to the localized heating approach described in the previous embodiment, other trigger mechanisms may be utilized to generate the initial fracture required to generate powderization of the thermally tempered glass substrate. For example, suitable triggering mechanisms may be produced that generate localized fracturing using by initiating a chemical reaction on the surface of the thermally tempered glass substrate, or by applying a localized mechanical pressure (e.g., using a piezoelectric element) to the stressed thermally tempered glass substrate.

FIGS. 6(A) to 6(G) depict the fabrication and actuation of a transient electronic device 100E according to another embodiment of the present invention in which defects sites are created to promote fracturing.

Figure 6A:
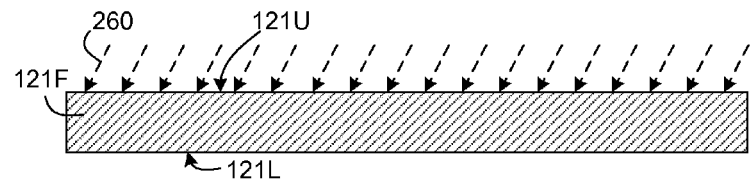
FIGS. 6(A), 6(B), 6(C), 6(D), 6(E), 6(F) and 6(G) are cross-sectional side views showing a transient electronic device produced in accordance with another embodiment of the present invention.
Figure 6B:
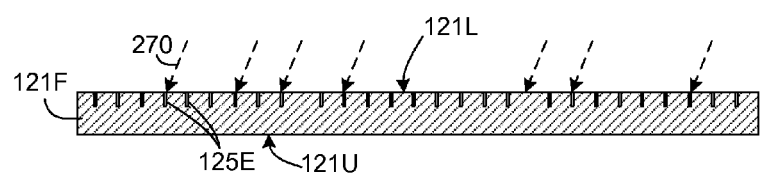
Figure 6C:
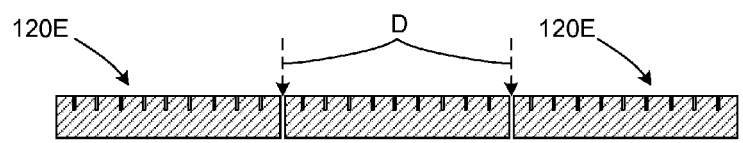

FIGS. 6(A) to 6(C) depict the generation of IC chips 120E having the requisite facture features. FIG. 6(A) depicts a "normal" semiconductor (e.g., monocrystalline silicon) functional substrate 121F during an established low-cost, high-volume (e.g., CMOS) fabrication process in which electronic elements are produced on upper surface 121F. FIG. 6(B) depicts functional substrate 121E after lower surface 121L is subject to polishing (i.e., to reduce the substrate thickness), and the generation of patterned fracture features 125E by laser beams 260 directed onto lower surface 121L from a laser ablation tool using known laser-scoring techniques. Alternatively, a process similar to "stealth dicing" technology developed by Hamamatsu Photonics K.K. of Japan may be used, in which a laser focus internal to the silicon creates defects which promote cracking. FIG. 6(C) shows subsequent dicing cuts D applied to segment the wafer into individual IC die 120E.

Figure 6D:
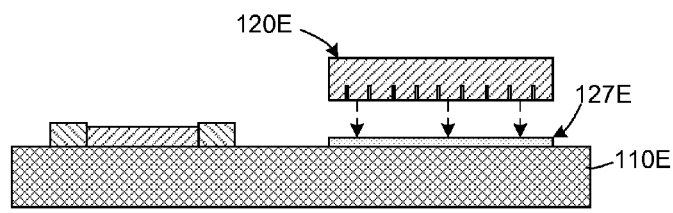
Figure 6E:
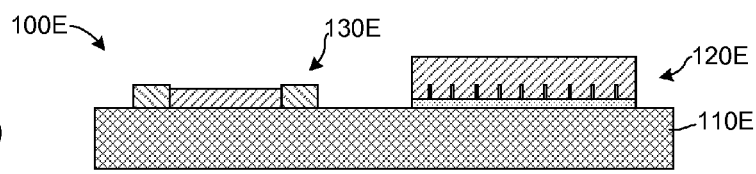
Figure 6F:
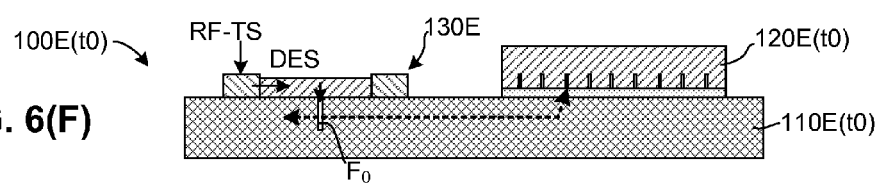
Figure 6G:
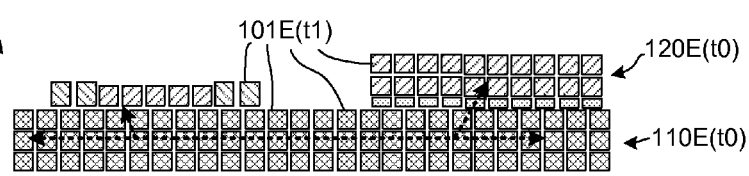

FIGS. 6(D) to 6(G) illustrate the subsequent completion of transient electronic device 100E using IC die 120E. FIG. 6(D) depicts mounting IC die (functional substrate) 120E on thermally tempered glass substrate 110E, which is produced in accordance with any of the methodologies mentioned above, by way of a sealing glass 127E (or an anodic bond) in the manner described above. FIG. 6(E) depicts completed device 100E formed by thermally tempered glass substrate 110E, IC chip (functional substrate or layer) 120E, and a triggering mechanism 130E formed in accordance with any of the embodiments mentioned above. FIGS. 6(F) and 6(G) show the subsequent controlled destruction (disaggregation) of device 100E, with FIG. 6(F) depicting device 100E(t0) during the transmission of trigger signal RF-TS to triggering mechanism 130E, which in turn generates an initial fracture $F_0$ in thermally tempered glass substrate 110E according to one of the mechanisms mentioned above, and FIG. 6(G) depicting the subsequent powderized device 100E(t1) caused by the propagation of fractures throughout the various structures, thereby forming particles 101E(t1). The resulting patterned fracture features (grooves) 125E should have a much higher defect density than the base polished silicon, so cracks are expected to readily form at these features, whereby fragmentation (i.e., the size of particles 101E(t1)) is controlled through the spacing of these defects.

Figure 7A:
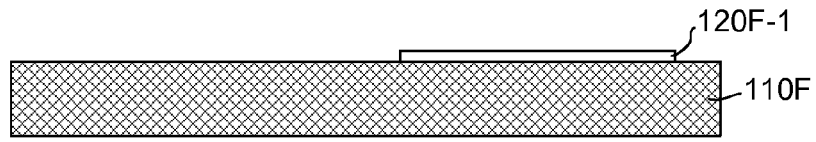
FIGS. 7(A), 7(B), 7(C), 7(D) and 7(E) are cross-sectional side views showing a transient electronic device produced in accordance with another embodiment of the present invention.
Figure 7B:
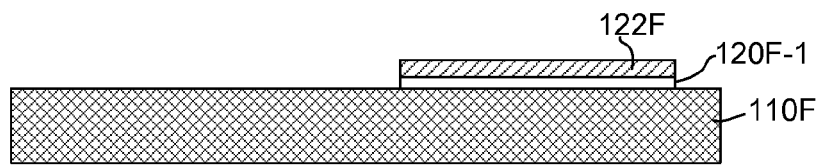
Figure 7C:
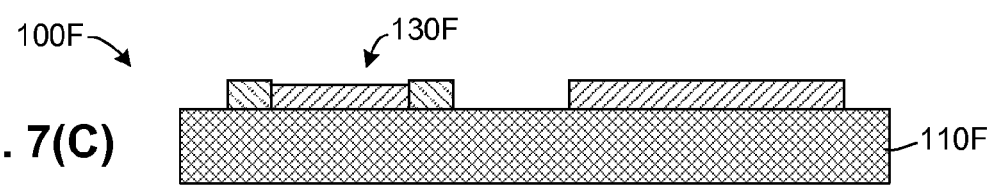
Figure 7D:
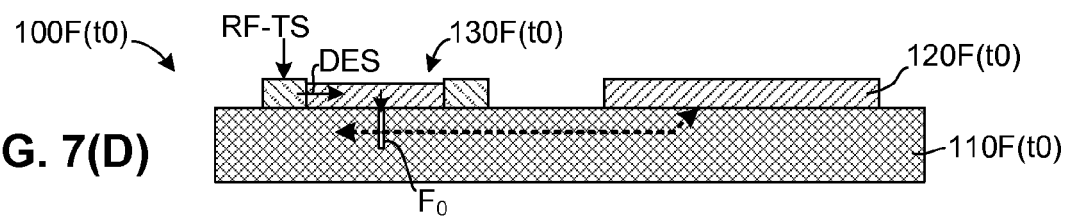
Figure 7E:
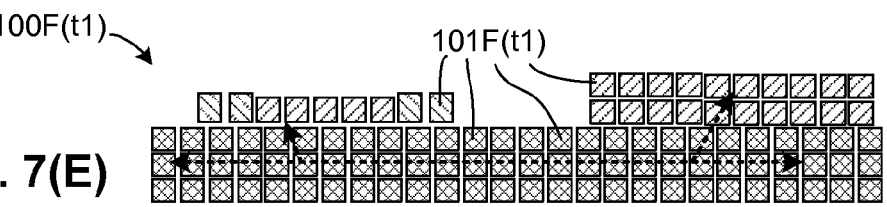

FIGS. 7(A) to 7(C) depict the fabrication and actuation of a transient electronic device 100F according to another exemplary embodiment of the present invention in which a thin-film polysilicon and/or amorphous silicon proxy is used to form electronic elements directly on a thermally tempered glass substrate 100F. FIG. 7(A) depicts a thermally tempered glass substrate 110F produced in accordance with any of the methodologies mentioned above with a base functional layer 120F (e.g., polycrystalline or amorphous silicon) formed thereon, FIG. 7(B) depicts the subsequent generation of electronic elements 122 in and on base functional layer 120E-1 by way of existing large area electronic ink-jet print processes, and FIG. 7(C) depicts the subsequent generation of a triggering mechanism 130F according to any of the embodiments mentioned above, thereby completing device 100F. FIGS. 7(D) and 7(E) show the subsequent controlled destruction (disaggregation) of device 100F, with FIG. 7(D) depicting device 100F(t0) during the transmission of trigger signal RF-TS to triggering mechanism 130F, which in turn generates an initial fracture $F_0$ in thermally tempered glass substrate 110F according to one of the mechanisms mentioned above, and FIG. 7(E) depicting the subsequent powderized device 100F(t1) caused by the propagation of fractures throughout the various structures, thereby forming particles 101F (t1). This embodiment may be useful, for example, if for some reason the single-crystal approach fails. That is, thin film circuitry 122F represents a way to reach near-COTS-level performance with thermally tempered glass substrates 110F. If processed correctly, thin film silicon layer 120F forms a bond to thermally tempered glass substrate 110F that is similar to that of the thermally tempered glass substrate material (e.g., glass). Furthermore, polysilicon and amorphous silicon are weaker than single-crystal silicon, and existing thin-film printing processes allow very thin layers to be formed and processed as the functional materials directly on the thermally tempered glass substrate (rather than requiring a thicker single-crystal silicon substrate as support between the transient substrate and the functional materials). For these reasons, this approach presents a relatively low risk path to demonstrating silicon circuit proxies on thermally tempered glass substrates. However, there are challenges associated with this approach as well. For example, there are multiple handling and processing steps that will expose the substrates to stresses and thermal gradients that could inadvertently trigger fragmentation, so custom processing may need to be developed.

Figure 8:
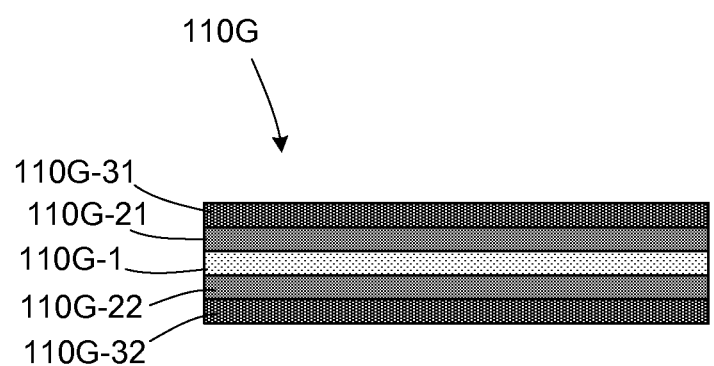
FIG. 8 is a simplified cross-sectional side view depicting an exemplary 5-layer laminated-type thermally tempered glass substrate according to another embodiment of the present invention.

Although the present invention has been described with respect to certain specific embodiments, it will be clear to those skilled in the art that the inventive features of the present invention are applicable to other embodiments as well, all of which are intended to fall within the scope of the present invention. For example, the laminated approach described above with reference to FIGS. 3(A) to 3(C) is not limited to three glass sheets, and may include three or more different glass materials. FIG. 8 shows an exemplary alternative thermally tempered glass substrate 110G having a five-layer laminated structure including an innermost (first) glass sheet 110G-1, two intermediate (second and third) glass sheets 110G-21 and 110G-22, and two outermost (fourth and fifth) glass sheets 110G-31 and 110G-32. The five glass sheets are assembled and fused together using a process similar to that described above with reference to FIGS. 3 and 3(A) to 3(C), where inner glass sheet 110G-1 and intermediate glass sheets 110G-21 and 110G-22 form a three-layer inner stack structure similar to that described above with reference to FIG. 3(C), and this inner stack is sandwiched between outmost glass sheets 110G-31 and 110G-32 before performing a heating/melting process at a temperature that fuses innermost glass sheet 110G-1 to inward-facing surfaces of intermediate glass sheets 110G-21 and 110G-22, and fuses outermost glass sheets 110G-31 and 110G-32 to outward-facing surfaces of intermediate glass sheets 110G-21 and 110G-22, respectively. In a presently preferred embodiment, outmost glass sheets 110G-31 and 110G-32 comprise a different (third) glass material having a lower (third) CTE value and higher softening temperature than the (second) CTE and softening temperature value of the glass material used to form intermediate glass sheets 110G-21 and 110G-22, which has a lower CTE value and higher softening temperature than the (first) CTE and softening temperature values of the glass material used to form innermost glass sheets 110G-1. In a specific example, central layer 100A-1 is implemented using Borsilicate (D263-Schott) glass having a CTE of 7.2 ppm/C and a softening temperature of 736° C., intermediate layers 100A-21 and 100A-22 are implemented using alkali free (AF45-Schott) glass having a CTE of 4.5 ppm/C and a softening temperature of 883° C., and additional glass sheets 110G-31 and 110G-32 comprise a (third) glass material having a (third) CTE value that is lower than the first and second CTE values and a softening temperature that is higher than that of the first and second glass materials (e.g., Willow glass having a CTE of 4.0 ppm/C and a softening temperature of 970° C.).

The invention claimed is:

1. A thermally tempered glass substrate comprising:
   a first glass structure including a first glass material having a first coefficient of thermal expansion (CTE) value;
   a plurality of second glass structures respectively including one or more second glass materials respectively having a second CTE value, the second CTE value being different from the first CTE value,
   wherein the plurality of second glass structures are integrally attached to the first glass structure such that the difference between the first CTE value and the second CTE value generates residual tensile and compressive stresses, and such that the residual tensile and compressive stresses remain stable until said thermally tempered glass substrate is subjected to an externally applied initial fracture force sufficient to generate secondary fractures that propagate throughout said thermally tempered glass substrate, whereby said thermally tempered glass substrate is powderized.

2. The thermally tempered glass substrate according to claim 1,
   wherein the a first glass structure comprises a first glass sheet,
   wherein the plurality of second glass structures comprises a second glass sheet and a third glass sheet comprising a second glass material having a second CTE value that is lower than the first CTE value, and
   wherein the first glass sheet is sandwiched between and fused to the second and third glass sheets.

3. The thermally tempered glass substrate according to claim 2,
   wherein the first glass material has a first softening temperature, and
   wherein the second glass material has a second softening temperature that is higher than the first softening temperature of the first glass material.

4. The thermally tempered glass substrate according to claim 2,
   wherein the first glass material comprises one of a high CTE-value Borsilicate glass and soda-lime glass, and
   wherein the second glass material comprises one of Quartz glass, a low CTE-value Borsilicate glass, Willow glass, and alkali free glass.

5. The thermally tempered glass substrate according to claim 4, wherein the first glass sheet comprises said high CTE-value Borsilicate glass and the second and third glass sheets comprise Willow glass.

6. The thermally tempered glass substrate according to claim 2, further comprising:
   fourth and fifth glass sheets comprising a third glass material having a third CTE value that is lower than the second CTE value, and
   wherein the first, second and third glass sheets are sandwiched between and fused to the fourth and fifth glass sheets.

7. The thermally tempered glass substrate according to claim 6, wherein the first glass sheet comprises a high CTE-value Borsilicate glass, the second and third glass sheets comprise alkali free glass, and the fourth and fifth glass sheets comprise Willow glass.

8. The thermally tempered glass substrate according to claim 1,
   wherein the a first glass structure comprises a glass layer,
   wherein the plurality of second glass structures comprises a plurality of spaced-apart elements integrally disposed in said glass layer, said second glass material having a second CTE value that is higher than the first CTE value, and said spaced-apart particles being fused to said glass layer such that a mismatch between the first CTE value and the second CTE value generates said residual tensile and compressive stresses.

9. The thermally tempered glass substrate according to claim 8, wherein each of the plurality of spaced-apart elements comprises one of a cylindrical structure and a spherical structure.

10. The thermally tempered glass substrate according to claim 9,
    wherein the glass layer has a thickness in the range of 200 μm and 1000 μm, and
    wherein each of the plurality of spaced-apart elements comprises a glass bead having a diameter in the range of 25 μm and 100 μm.

11. The thermally tempered glass substrate according to claim 8,
    wherein the glass layer comprises alkali free glass, and
    wherein said plurality of spaced-apart elements comprise soda-lime glass beads.

12. A method for manufacturing a transient electronic device comprising:
    forming a thermally tempered glass substrate including:
    disposing a first glass structure and a plurality of second glass structures in an intermixed arrangement, said first glass structure including a first glass material having a first coefficient of thermal expansion (CTE) value and a first thermal transition point temperature, and said plurality of second glass structures including a second glass material having a second CTE value and a second thermal transition point temperature, the second CTE value being different from the first CTE value,
    heating the intermixed arrangement of first and second glass structures to a temperature higher than the first and second glass transition points such that the first and second glass materials melt and fuse together; and
    cooling the melted/fused first and second glass structures such that the difference between the first and second CTE values generates and stores potential energy in the form of residual, self-equilibrating internal stresses.

13. The method of claim 12, wherein disposing the first glass structure and said plurality of second glass structures in an intermixed arrangement comprises sandwiching a first glass sheet between a second glass sheet and a third glass sheet, wherein said first glass sheet comprises said first glass material and said second and third glass sheets comprise said second glass material, and wherein said first CTE value of said first glass material is higher than the second CTE value of said second glass material.

14. The method of claim 13, wherein sandwiching said first glass sheet between said second and third glass sheets comprises disposing one of a high CTE-value Borsilicate glass sheet and soda-lime glass sheet between two glass sheets comprising one of Quartz glass, a low CTE-value Borsilicate glass, Willow glass, and alkali free glass.

15. The method of claim 13,
wherein heating the intermixed arrangement of first and second glass structures comprises simultaneously fusing the first glass sheet to the second and third glass sheets, and
wherein cooling the first and second glass structures comprises cooling the fused stack.

16. The method of claim 12, wherein disposing the first glass structure and said plurality of second glass structures in an intermixed arrangement comprises forming an inner stack including a first glass sheet disposed between a second glass sheet and a third glass sheet, and sandwiching said inner stack between a fourth glass sheet and a fifth glass sheet.

17. The method of claim 12, wherein disposing the first glass structure and said plurality of second glass structures in an intermixed arrangement comprises forming a layer including a mixture of glass powder and glass elements, wherein said glass powder comprises said first glass material and said glass elements comprise said second glass material, and wherein said first CTE value of said first glass material is lower than the second CTE value of said second glass material.

18. The method of claim 17,
wherein said glass powder comprises glass particles having a nominal size of 5 μm or less,
wherein said glass elements comprise one of glass cylinders and glass spheres having a nominal size in the range of 50 μm and 100 μm, and
wherein forming said layer comprises forming a paste including said glass elements disposed inside said glass particles.

19. The method of claim 17, wherein heating the layer comprises melting the glass particles to form a continuous glass layer having said glass elements disposed therein.

20. A transient electronic device comprising:
a thermally tempered glass substrate including:
a first glass structure including a first glass material having a first coefficient of thermal expansion (CTE) value;
a plurality of second glass structures respectively including one or more second glass materials respectively having a second CTE value, the second CTE value being different from the first CTE value,
wherein the plurality of second glass structures are integrally attached to the first glass structure such that the difference between the first CTE value and the second CTE value generates residual tensile and compressive stresses, and such that the residual tensile and compressive stresses remain stable until said thermally tempered glass substrate is subjected to an externally applied initial fracture force sufficient to generate secondary fractures that propagate throughout said thermally tempered glass substrate, whereby said thermally tempered glass substrate is powderized, and
a trigger mechanism attached to the thermally tempered glass substrate and including means for generating an initial fracture in said thermally tempered glass substrate,
wherein said residual tensile and compressive stresses are sufficient to generate secondary fractures in response to said initial fracture that propagate throughout said thermally tempered glass substrate, whereby said thermally tempered glass substrate is powderized.

* * * * *